United States Patent
Park et al.

(10) Patent No.: US 6,728,650 B2
(45) Date of Patent: Apr. 27, 2004

(54) HIGH POWER AMPLIFIER OPERATING POINT DETERMINATION APPARATUS AND METHOD FOR SATELLITE COMMUNICATIONS SYSTEM

(75) Inventors: Jong Heung Park, Taejon (KR); Byoung Hyun Chung, Taejon (KR); Seung Woo Chung, Taejon (KR); Seong-Pal Lee, Taejon (KR)

(73) Assignee: Electronics and Telecommunications Research Institute, Taejon (KR)

( * ) Notice: Subject to any disclaimer, the term of this patent is extended or adjusted under 35 U.S.C. 154(b) by 180 days.

(21) Appl. No.: 09/986,150

(22) Filed: Nov. 7, 2001

(65) Prior Publication Data

US 2003/0055590 A1 Mar. 20, 2003

(30) Foreign Application Priority Data

Sep. 17, 2001 (KR) .......................... 2001-57348

(51) Int. Cl.[7] .......................... G06F 19/00; H04B 7/185
(52) U.S. Cl. .......................... 702/107; 370/318; 455/13.1
(58) Field of Search .......................... 702/188; 370/318; 455/13.1–13.4

(56) References Cited

U.S. PATENT DOCUMENTS 5,731,993 A    3/1998   Wachs et al.

2002/0177404 A1 * 11/2002 Hudson et al. ............ 455/13.4

FOREIGN PATENT DOCUMENTS

| KR | 1996 0036152 | 8/1996  | ............ H04B/7/02 |
| KR | 1996-0076239 | 12/1996 | ............ H04B/7/15 |
| KR | 1998-44166   | 9/1998  | ............ H03G/7/00 |
| KR | 1998-59146   | 10/1998 | ............ H03G/3/20 |

* cited by examiner

*Primary Examiner*—Patrick Assouad
(74) *Attorney, Agent, or Firm*—Jacobson Holman PLLC

(57) ABSTRACT

A high power amplifier operating point determination apparatus and method determines an operating point of a high power amplifier for satellite communications system. For the purpose, the apparatus employs a DC voltage converting block in a channel amplifier located at a front-end of the high power amplifier, which couples an output power of the channel amplifier and converts the coupled output power to a DC voltage. Accordingly, in a ground monitoring center, before satellite launching, there are mapped the output power value of the high power amplifier and the DC voltage level of the channel amplifier per each command step assigned to an FGM or an ALC mode. After the satellite launching, it is possible to detect the operating point and the output power level of the high power amplifier based on mapped results by using the DC voltage level as telemetry information.

9 Claims, 4 Drawing Sheets

HIGH POWER AMPLIFIER OPERATING POINT DETERMINATION APPARATUS AND METHOD FOR SATELLITE COMMUNICATIONS SYSTEM

FIELD OF THE INVENTION

The present invention relates to satellite communication systems; and, more particularly, to an apparatus and method for determining an operating point of a high power amplifier (HPA) by adding a direct current (DC) voltage converting block to a channel amplifier located at a front-end of the high power amplifier and using signal information outputted from the DC voltage converting block, and a computer readable recording medium on which a program implementing the method is recorded, wherein the operating point relates to a downlink signal transmitted from a communication and broadcasting satellite to the earth.

PRIOR ART OF THE INVENTION

For any transponder's channel, since an operating point of a high power amplifier changes depending on the intensity variation of a signal transmitted from an earth station to a satellite which is due to operating changes of self transmit power of earth stations sharing a certain transponder's channel, the number of carriers, atmospheric changes depending on the rainfall and so on, a ground monitoring center should check the operating point of the high power amplifier in real-time.

In the meantime, a system and method for determining an operating point of a nonlinear high power amplifier operating in a satellite is described in U.S. Pat. No. 5,731,993, entitled "Nonlinear Amplifier Operating Point Determination System and Method" and issued on Mar. 24, 1998. As shown in this patent document, in order to determine an operating point of a high power amplifier within a transponder, a test signal source is embodied in a front-end of a high power amplifier corresponding to each channel and a summing circuit is further employed to combine the test signal source and a main signal source. As a result, a signal analyzer equipped in the transponder determines the operating point by using a signal provided from an output multiplexer. Further, by placing an additional antenna in a satellite and receiving a signal source delivered from a transmit antenna, the signal analyzer interprets the received signal.

However, in the above two cases, additional electrical devices should be equipped in the satellite, which leads a non-economical influence, and the introduced method can extract the operating point only in the time division multiple access (TDMA) scheme.

Currently, it is difficult on the earth to directly and exactly detect an output power of a high power amplifier in a satellite located on a stationary orbit at an altitude of 36,000 km above the ground since there are operating environment changes of the high power amplifier, transmission loss changes depending on the rainfall, an error of a power measuring system and so on. To overcome the drawbacks, the high power amplifier transmits a telemetry signal related to an output level to a ground monitoring center which checks a state of the high power amplifier by using the telemetry signal. The communication and broadcasting satellite uses a traveling wave tube amplifier (TWTA) as the high power amplifier and, in this case, the operating point and the output power level of the high power amplifier are measured by utilizing telemetry of anode voltage or Helix current. However, practically, it deteriorates discrimination in determining the output level of the high power amplifier.

SUMMARY OF THE INVENTION

It is, therefore, a primary object of the present invention to provide an apparatus and method for determining an operating point of a high power amplifier by adding a direct current (DC) voltage converting block to a channel amplifier located at a front-end of the high power amplifier and using signal information outputted from the DC voltage converting block, and a computer readable recording medium on which a program implementing the method is recorded, wherein the operating point relates to a downlink signal transmitted from a communication and broadcasting satellite to the earth.

In accordance with one aspect of the present invention, there is provided an apparatus for determining an operating point of a high power amplifier, comprising:

direct current (DC) voltage converting unit for coupling an output power of a channel amplifier and converting the coupled output power to a DC voltage;

storing unit in a ground monitoring center for, before satellite launching, for whole channels of a satellite transponder, mapping the output power value of the high power amplifier and the DC voltage level of the channel amplifier per each command step assigned to either a fixed gain mode (FGM) or an automatic level control (ALC) mode and storing mapped results; and operating point detecting unit in the ground monitoring center for, after the satellite launching, detecting the operating point and the output power level of the high power amplifier of a corresponding channel based on the mapped results stored in the storing unit by using the DC voltage level measured at the DC voltage converting unit as telemetry information.

In accordance with another aspect of the present invention, there is provided a method for determining an operating point of a high power amplifier for use in a satellite communication system, which comprises the steps of:

(a) employing a circuit for converting an output power level of a channel amplifier to a direct current (DC) voltage within the channel amplifier so as to detect an operating point of the high power amplifier and a transmit power level of each channel for a down link signal transmitted from a satellite to an earth station;

(b) before satellite launching, when testing each command step of the channel amplifier, measuring a DC voltage according to the output power level of the channel amplifier in a fixed gain mode (FGM) and an automatic level control (ALC) mode and producing a mapping table by mapping the output power value of the high power amplifier and the DC voltage value of the channel amplifier; and (c) after the satellite launching, determining the operating point and the output power level of the high power amplifier for a corresponding channel based on the mapping table by using the DC voltage level measured at the DC voltage converting circuit as telemetry information.

In accordance with still another aspect of the present invention, there is provided a computer readable medium on which a program used in implementing a high power amplifier operating point determination method for use in a satellite communication system employing a processor is recorded, comprising:

first program instructing function for, to detect an operating point of a high power amplifier and a transmit power level of each channel for a down link signal transmitted from a satellite to an earth station, before satellite launching, when testing each command step of a channel amplifier, measuring a DC voltage according to an output power level of the channel amplifier in a fixed gain mode and an automatic level control mode and producing a mapping table by mapping the output power value of the high power amplifier and the DC voltage value of the channel amplifier; and second program instructing function for, after the satellite launching, determining the operating point and the output power level of the high power amplifier for a corresponding channel based on the mapping table by using the DC voltage level measured at a circuit for converting the output power level of the channel amplifier to a DC voltage as telemetry information.

The present invention uses information of a channel amplifier located in an front-end of a high power amplifier so as to detect a transmit power level for each channel and operating point information of the high power amplifier for a downlink signal transmitted from a satellite to an earth station, and adds a circuit for converting an output power level of the channel amplifier to a DC voltage to an RF circuit of the channel amplifier to thereby use the information outputted from the channel amplifier as telemetry. Then, before satellite launching, the DC voltage is measured according to the output power level of the channel amplifier for a fixed gain mode and an automatic level control mode when testing the channel amplifier and a database is made of information for the output power values of the channel amplifier and the high power amplifier for the two modes. As a result, after the satellite launching, a ground monitoring center can measure the operating point and the output level of the high power amplifier by only analyzing the DC voltage information of the channel amplifier among the telemetry signals transmitted from the satellite.

That is to say, the present invention detects the operating point of the high power amplifier by using the output power information of the channel amplifier located in an front-end of the high power amplifier and adopts a scheme of utilizing the correlativity between the output power value of the high power amplifier and the DC voltage information acquired by coupling the output power of the channel amplifier to an internal circuit and converting the coupled power value to a DC voltage when manufacturing the channel amplifier.

Therefore, it is possible to allow a system operator to notice the operating point and the output level of the high power amplifier by using the DC voltage information as a telemetry signal and making the ground monitoring center interprets the DC voltage telemetry information. Further, the satellite system can be effectively managed by sending a new command signal to the channel amplifier according to the operational environment of the satellite system. This can be also used as a back-up when the telemetry of the high power amplifier has errors.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Hereinafter, with reference to the drawings, a preferred embodiment of the present invention will be explained in detail.

Figure 1:
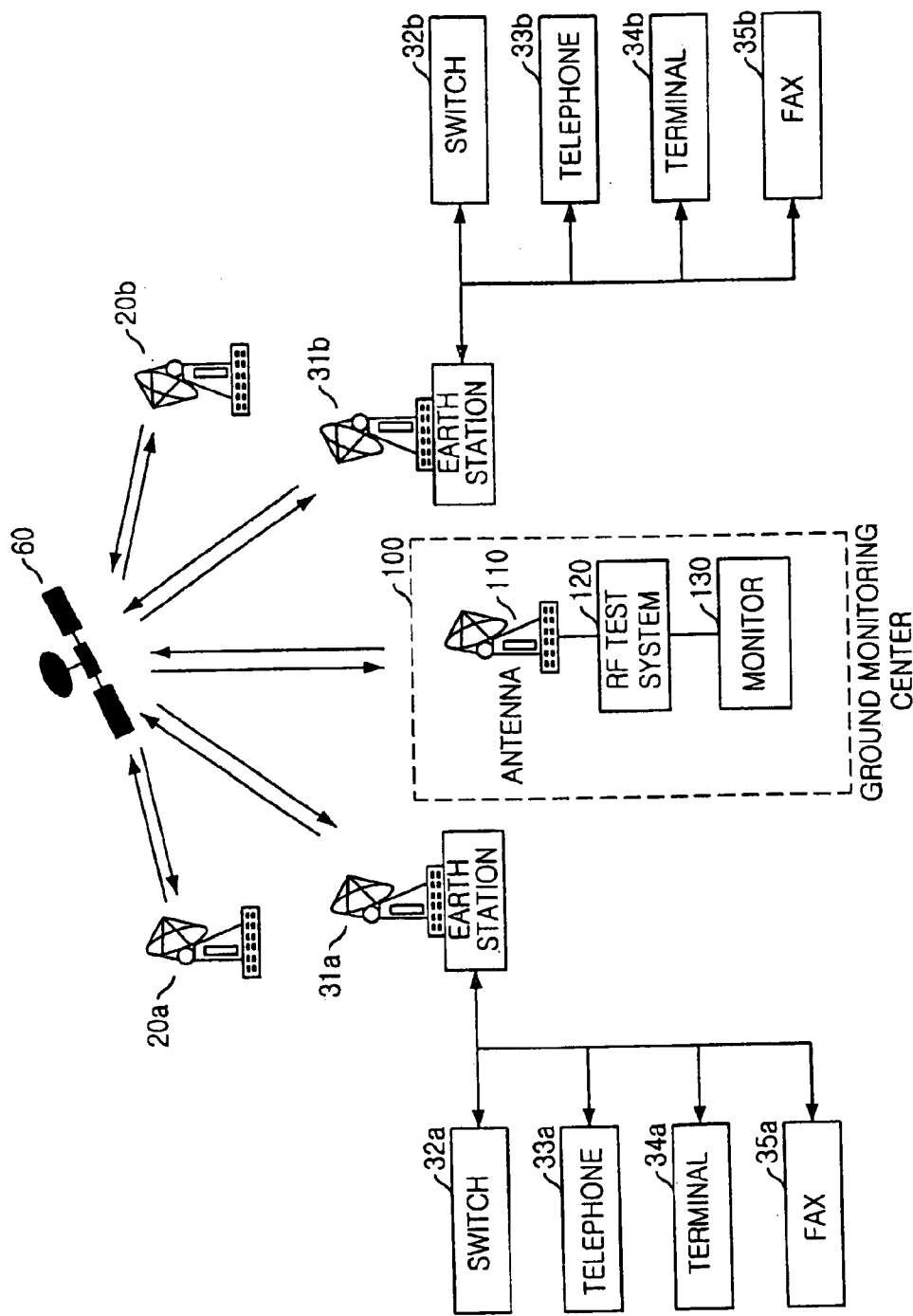
FIG. 1 shows a block diagram of a satellite communication system in accordance with the present invention.

Referring to FIG. 1, there is shown a block diagram of a satellite communication system in accordance with the present invention.

As described in FIG. 1, the satellite communication system comprises: a satellite 60 employing a plurality of communication and broadcasting channels; a ground monitoring center 100 which entirely controls and monitors the satellite communication system and includes an antenna 110 having a transceiving function, a radio frequency (RF) test system 120 and a monitor 130; earth stations 31a and 31b which have an interfacing function for terminals, e.g., switches 32a and 32b, telephones 33a and 33b, data terminals 34a and 34b such as computers, facsimiles 35a and 35b, etc. and provides a communication function for the terminals; and user terminals 20a and 20b through which users can singly receive the communication and broadcasting channels.

Figure 2:
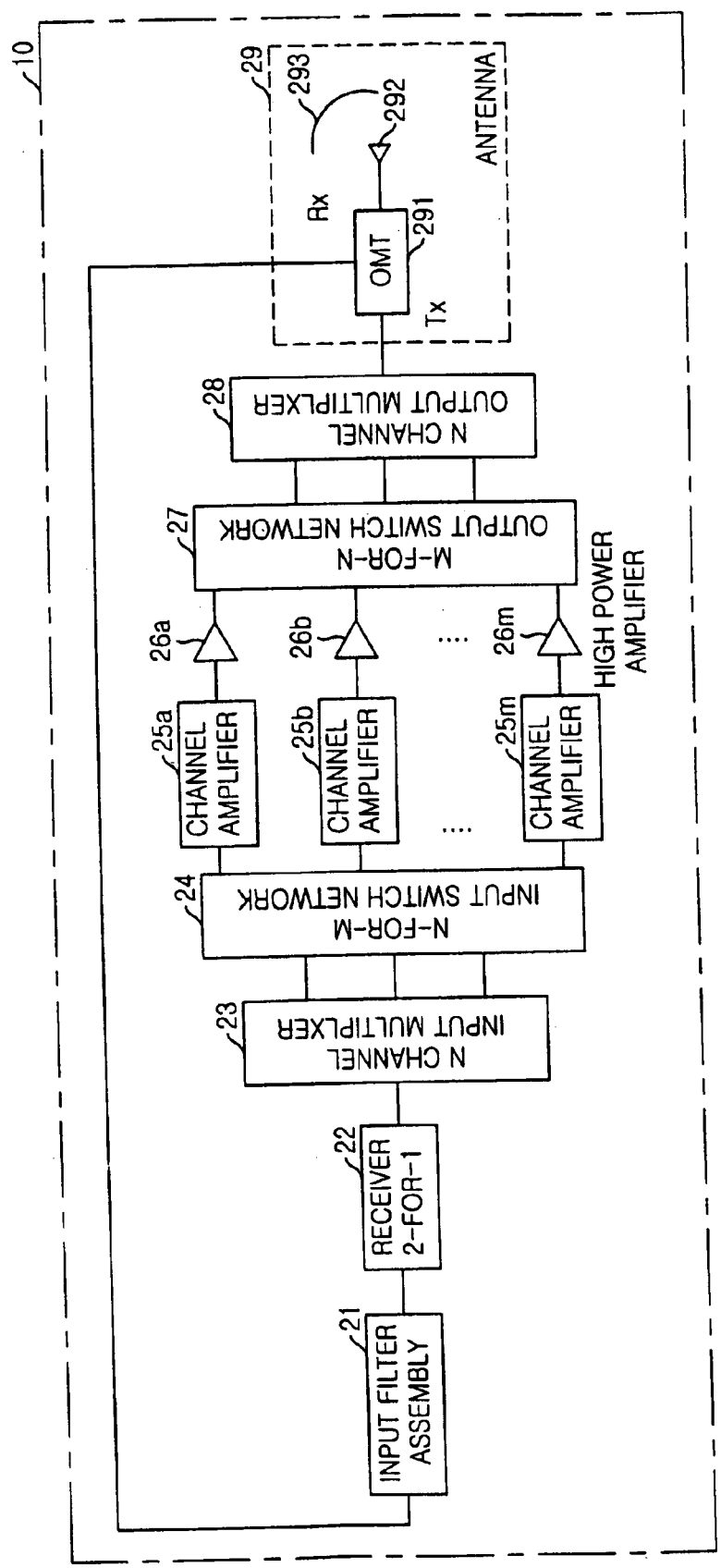
FIG. 2 illustrates a block diagram of a communication and broadcasting satellite transponder in accordance with the present invention.

Referring to FIG. 2, there is illustrated a block diagram of a communication and broadcasting satellite transponder in accordance with the present invention.

A reference numeral 10 denotes a communication and broadcasting satellite transponder located in a satellite including a plurality of communication and broadcasting channels and a reference numeral 29 denotes an antenna including an ortho mode transducer (OMT) 291, a feedhorn 292 and a reflector 293.

Signals supplied from a receiving antenna are sequentially transmitted through an input filter assembly 21, a receiver 2-FOR-1 22, an N channel input multiplexer 23 and an N-FOR-M input switch network 24 and, then, channelized signals are amplified by passing through channel amplifiers 25a to 25m and high power amplifiers 26a to 26m. The amplified signals are delivered via an M-FOR-N output switch network 27 and combined at an N channel output multiplexer 28. The combined signal is transmitted to the earth through a transmit antenna.

Each of the earth stations 31a and 31b in FIG. 1 can solely use one channel of the communication and broadcasting satellite transponder or share one channel with other earth stations. Therefore, when a multiplicity of carriers are inputted to the channel of the transponder, since nonlinear characteristics of AM/AM (amplitude/amplitude), AM/PM (amplitude/phase) become critical and the inter-modulation product between the carriers becomes intensified as the operating points of the high power amplifiers, e.g., 26a to 26m in FIG. 2, approach to a saturation point region, it is required to back-off the operating points of the high power amplifiers to an appropriate point. In order to prevent the above-mentioned inter-modulation from occurring, the ground monitoring center has to continuously check an operating point of a high power amplifier corresponding to each channel.

Figure 3:
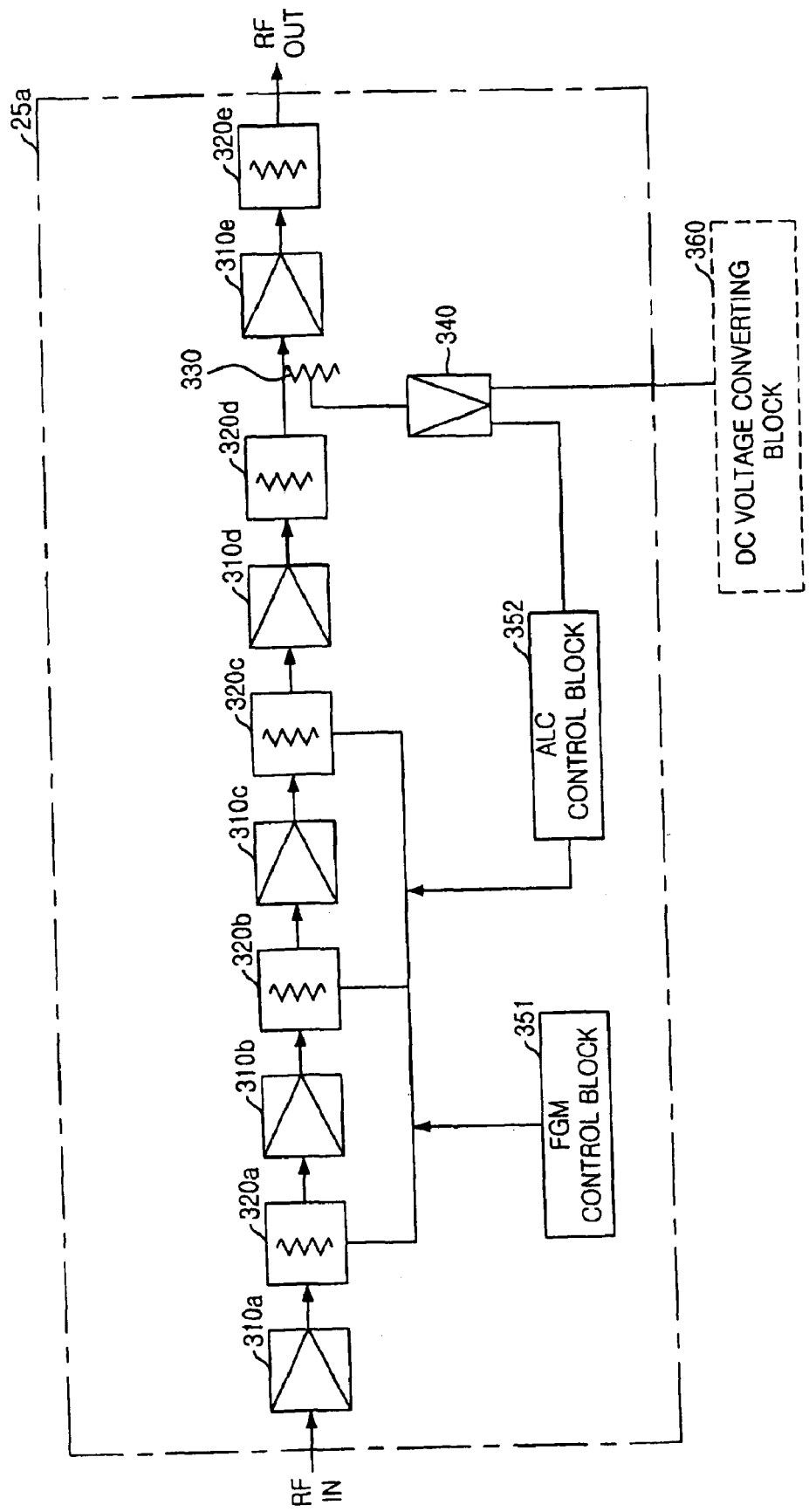
FIG. 3 is a detailed block diagram of a channel amplifier 25a, 25b, 25m in FIG. 2 for use in determining an operating point of a high power amplifier in accordance with an embodiment of the present invention.

Referring to FIG. 3, there is provided a block diagram of a channel amplifier for use in determining an operating point of a high power amplifier in accordance with an embodiment of the present invention, which includes a DC voltage converting block.

First of all, to determine the operating point of the high power amplifier, the DC voltage converting block 360 is added to the channel amplifier 25a as shown in FIG. 3.

The inventive high power amplifier operating point determination apparatus includes: the DC voltage converting block 360, added to the channel amplifier 25a in the satellite transponder 10 in FIG. 2, for coupling the output power of the channel amplifier 25a and then converting the output power to a DC voltage so as to determine the operating point and the output power level of the high power amplifier 26a in FIG. 2; a database (not shown) in the ground monitoring center 100 in FIG. 1 for, before the satellite launching, for the entire channels of the satellite transponder 10, mapping the DC voltage level of the channel amplifier 25a and the output power value of the high power amplifier 26a and recording thereon the mapped results for each command step assigned to each of a fixed gain mode (FGM) and an automatic level control (ALC) mode; and the RF test system 120 in FIG. 1 in the ground monitoring center 100 for, after the satellite launching, measuring the operating point and the output power level of the high power amplifier 26a in FIG. 2 corresponding to a certain channel stored in the database by using the DC voltage level measured at the DC voltage converting block 360 as telemetry information.

Hereinafter, the channel amplifier 25a including the DC voltage converting block 360 will be described in detail so as to determine the operating point and the output power level of the high power amplifier 26a.

As illustrated in FIG. 3, the channel amplifier 25a has amplifiers 310a to 310e, attenuators 320a to 320e, a signal detector 330, a multiple operational (OP) amplifier 340, a fixed gain mode (FGM) control block 351, an automatic level control (ALC) block 352 and the DC voltage converting block 360.

In accordance with the present invention, by primarily amplifying a feeble signal for the value coupled at the signal detector 330 by using the multiple OP amplifier 340 and, then, allowing the channel amplifier 25a to include the DC voltage converting block 360 which converts the amplified signal to a DC voltage according to its amplitude, it is accomplished to obtain DC voltage information for the output voltage level of the channel amplifier 25a for both of the FGM and the ALC mode selected by an external command signal and to use the voltage signal converted at the DC voltage converting block 360 as a telemetry signal.

In general, the channel amplifier 25a can control the gain change of about 32 dB in the FGM mode and is designed to maintain a constant output value according to a preset command step in a range of about 16 dB in the ALC mode. In this case, it is possible to make the correlation accuracy of the DC voltage for the output power different according to the number of command steps employed in the designed channel amplifier.

Since an analog voltage signal of the satellite has a value in a range of 0 to 5 V, the discrimination of the output power level of the high power amplifier 26a can be sufficiently implemented by segmenting the output power into 256 steps when making telemetry data have 8 bit addresses in case of designing the DC voltage value corresponding to the output power level of the channel amplifier 25a to have a range of 0 to 5 V.

Figure 4:
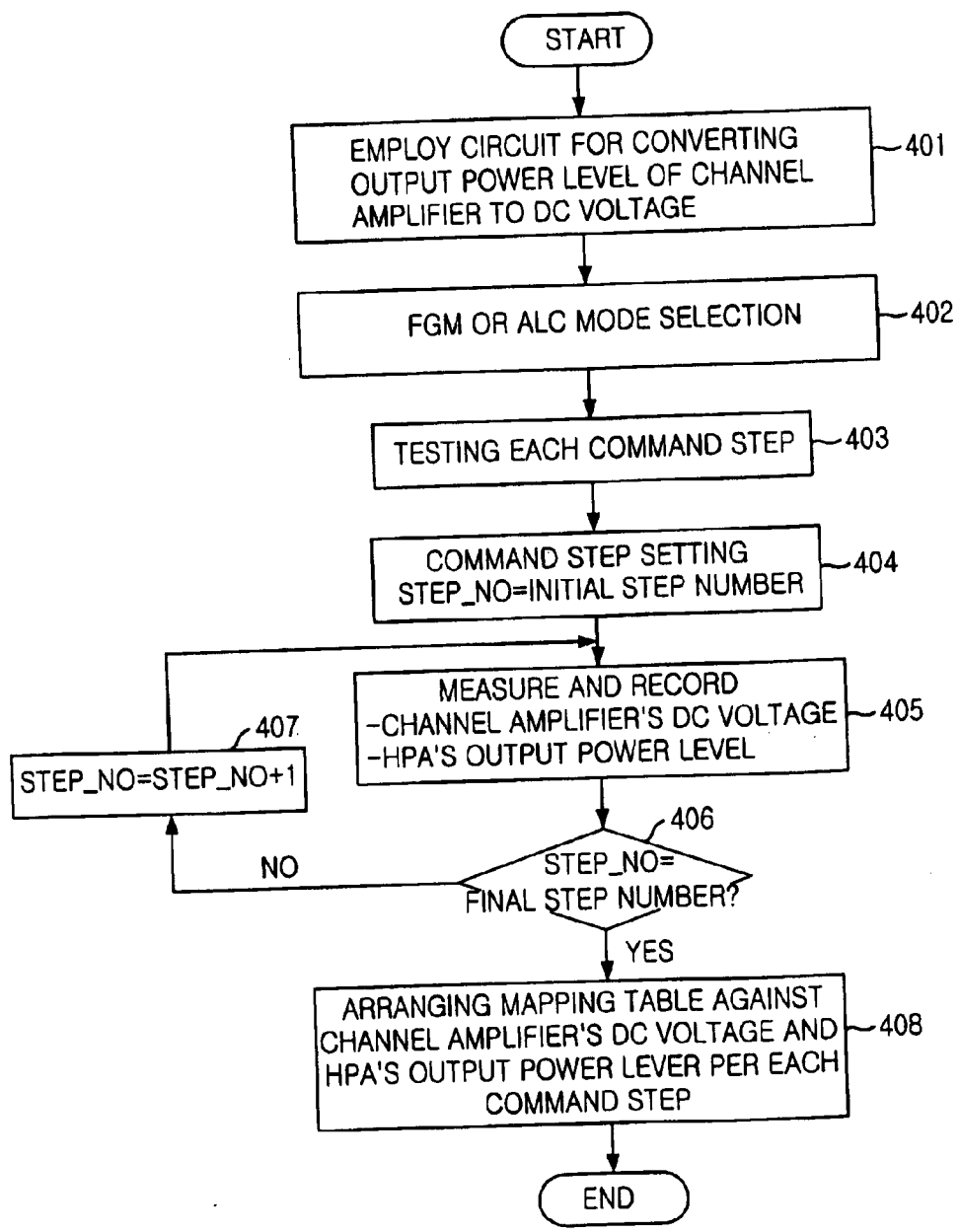
FIG. 4 provides a flowchart that illustrates a procedure of making out a mapping table to be used in determining an operating point of a high power amplifier in accordance with an embodiment of the present invention.

Referring to FIG. 4, there is provided a flowchart that shows a procedure of making out a mapping table to be used in determining the operating point of the high power amplifier in accordance with an embodiment of the present invention.

At first, in order to examine operating point information of the high power amplifier and a transmit power level of each channel for a downlink signal transmitted from the satellite to the earth station, in step 401, a circuit for converting the output power level of the channel amplifier to a DC voltage is employed in the RF circuit of the channel amplifier.

Then, after selecting either the FGM or the ALC mode in step 402, a test process is performed for each command step in step 403. When testing the channel amplifier, the DC voltage is measured according to the output power level of the channel amplifier in the FGM and the ALC mode through steps 404 to 407.

In step 408, a mapping table is made out for the DC voltage value of the channel amplifier and the output power level of the high power amplifier per each command step to thereby record the operating point and the output voltage level of the high power amplifier therein in the database form.

The above procedure will be described in detail herein below.

In step 401 in which the circuit for converting the output power of the channel amplifier to the DC voltage is included in the RF circuit of the channel amplifier, the multiple OP amplifier 340 and the DC voltage converting block 360 are primarily located in the channel amplifier as shown in FIG. 3.

Herein, the DC voltage converting block 360 is provided with a signal, which is obtained by properly amplifying at the multiple OP amplifier 340 the signal supplied from the signal detector 330. This amplified signal passes through the DC voltage converting block 360.

The typical channel amplifier 25a in FIG. 3 has two functions of the FGM and the ALC mode. In order to implement the two functions, the channel amplifier 25a includes the FGM control block 351 and the ALC control block 352 but it uses only one of two modes in a practical operation.

Therefore, as shown in step 402 of FIG. 4, the channel amplifier 25a should have a function of selecting either the FGM or the ALC mode. In step 403 of FIG. 4, by setting a command step assigned to each of the FGM and the ALC mode by using the FGM control block 351 and the ALC control block 352, it is performed to vary an RF output for an RF input of the channel amplifier 25a, resulting in properly varying the RF output according to an operational environment of the satellite.

In the FGM, the RF output power value can be differently obtained by varying states of the attenuators 320a, 320b and 320c according to each command step. On the other hand, in the ALC mode, the RF output power value can be differently acquired by varying states of the attenuators 320a, 320b, 320c, 320d and 320e.

As described above, according to each command step, it is possible to measure the output power of the high power amplifier 26a for the RF input of the channel amplifier 25a in FIG. 2 by utilizing a power meter or a spectrum analyzer.

In step 405 of FIG. 4, there are measured and recorded the DC voltage measured at the DC voltage converting block 360 of the channel amplifier 25a and the output power of a corresponding high power amplifier determined in the whole command steps performed for the FGM or ALC mode.

Through steps 406 and 407 of FIG. 4, the above procedure is repeated for the whole command steps. If step 405 is completed for the whole command steps, the mapping table for the command step number is made out as shown in step 408. There are recorded in the mapping table the DC voltage of the channel amplifier and the output power of the high power amplifier per each command step for the FGM and the ALC mode.

As shown in FIG. 2, the above procedure should be performed for respective pairs of the channel amplifiers 25a to 25m and the high power amplifiers 26a to 26m. As a result, for the whole channels of the satellite transponder, there is made a database for DC voltage levels of channel amplifiers and output power values of high power amplifiers.

By using the DC voltage extracted at the DC voltage converting block 360 in FIG. 3 as a telemetry signal of a downlink, the ground monitoring center can receive in real-time DC voltage data transmitted from a channel amplifier corresponding to each channel of the satellite transponder and, thus, it is possible to estimate an output power operating point of each high power amplifier of the current satellite transponder by using the mapping table obtained in step 408 of FIG. 4.

As described above, this procedure is to detect the DC voltage value of the channel amplifier depending on its output power level and the output level of the high power amplifier by using the inventive method shown in FIG. 4 and is performed before the satellite launching.

As a result, as the ground monitoring center monitors the DC voltage telemetry of the channel amplifier based on the detected data when the satellite is operating on the stationary orbit, the operating point of the high power amplifier for its corresponding channel can be detected, so that it is capable of effectively operating the transponder according to the environment change of the satellite system.

That is, in order to detect the operating point and the output power level of the high power amplifier in the communication and broadcasting satellite transponder, the DC voltage converting block is added to the channel amplifier when producing the channel amplifier on the earth. Furthermore, when testing the communication and broadcasting satellite transponder before the satellite launching, in the FGM, there are mapped the output level data of the high power amplifier and the DC voltage which is measured at the DC voltage converting block according to the output power level of the channel amplifier for each command step in the given gain varying change and, in the ALC mode, there are mapped the output level data of the high power amplifier and the DC voltage which is measured at the DC voltage converting block according to the output power level of the channel amplifier for each command step in a given level control range. As a result, after the satellite launching, the ground monitoring center can detect the operating point of the high power amplifier of a corresponding channel based on only the telemetry information of the channel amplifier.

Moreover, the present invention can be used as a back-up for the telemetry of the TWTA as introduced in the present invention when the telemetry of the output level information owned in the TWTA has errors.

The inventive method described above can be implemented as a program, which is recorded on a computer-readable recording medium such as CD ROMs, RAMs, ROMs, floppy disks, hard disks, magneto-optical disks, etc.

In accordance with the present invention, by employing the DC voltage converting block in the channel amplifier located at the front-end of the high power amplifier so as to determine the operating point of the high power amplifier related to the downlink signal transmitted from the communication and broadcasting satellite to the earth, the ground monitoring center can detect the operating point of the high power amplifier of the certain channel by only regarding the telemetry information of the channel amplifier and effectively control the operating point of the high power amplifier according to the environment change of the satellite system.

Further, in accordance with the present invention, although the anode voltage or the Helix current is used as the telemetry of the output power state information when the TWTA is used as the high power amplifier in the communication and broadcasting satellite, it is possible to overcome a disadvantage that deteriorates the discrimination for each output level. There is also an effect that the present invention can be used as a back-up for the telemetry of the TWTA as introduced in the present invention when the telemetry of the output level information owned in the TWTA has errors.

While the present invention has been described with respect to the particular embodiments, it will be apparent to those skilled in the art that various changes and modifications may be made without departing from the spirit and scope of the invention as defined in the following claims.

What is claimed is:

1. An apparatus for determining an operating point of a high power amplifier for satellite communications, comprising:

direct current (DC) voltage converting means for coupling an output power of a channel amplifier and converting the coupled output power to a DC voltage;

storing means in a ground monitoring center for, before satellite launching, for whole channels of a satellite transponder, mapping the output power value of the high power amplifier and the DC voltage level of the channel amplifier per each command step assigned to either a fixed gain mode (FGM) or an automatic level control (ALC) mode and storing mapped results; and operating point detecting means in the ground monitoring center for, after the satellite launching, detecting the operating point and the output power level of the high power amplifier of a corresponding channel based on the mapped results stored in the storing means by using the DC voltage level measured at the DC voltage converting means as telemetry information.

2. The apparatus as recited in claim 1, wherein, before the satellite launching, the storing means maps, in the FGM, output level data of the high power amplifier and the DC voltage which is measured at the DC voltage converting means according to the output power level of the channel amplifier for each command step in the given gain varying change and, in the ALC mode, the output level data of the high power amplifier and the DC voltage which is measured at the DC voltage converting means according to the output power level of the channel amplifier for each command step in a given level control range.

3. A method for determining an operating point of a high power amplifier for use in a satellite communication system, which comprises the steps of:

(a) employing a circuit for converting an output power level of a channel amplifier to a direct current (DC) voltage within the channel amplifier so as to detect an operating point of the high power amplifier and a transmit power level of each channel for a down link signal transmitted from a satellite to an earth station;

(b) before satellite launching, when testing each command step of the channel amplifier, measuring a DC voltage according to the output power level of the channel amplifier in a fixed gain mode (FGM) and an automatic level control (ALC) mode and producing a mapping table by mapping the output power value of the high power amplifier and the DC voltage value of the channel amplifier; and (c) after the satellite launching, determining the operating point and the output power level of the high power amplifier for a corresponding channel based on the mapping table by using the DC voltage level measured at the DC voltage converting circuit as telemetry information.

4. The method according to claim 3, wherein the DC voltage is utilized as a telemetry signal.

5. The method according to claim 3, wherein, in the FGM, there are mapped an output power level of the channel amplifier according to each command step in the given gain varying change, a DC voltage which is measured at the DC voltage converting circuit and corresponds to the output power level of the channel amplifier, and the output level data of the high power amplifier.

6. The method according to claim 3, wherein, in the ALC mode, there are mapped an output power level of the channel amplifier according to each command step in a given level control range, a DC voltage which is measured at the DC voltage converting circuit and corresponds to the output power level of the channel amplifier, and the output level data of the high power amplifier.

7. The method according to claim 3, wherein the high power amplifier is used as a back-up for output power information of a traveling wave tube amplifier (TWTA) when telemetry of output level information owned in the TWTA has errors.

8. The method according to claim 7, wherein the telemetry is used in determining the operating point of the high power amplifier and varying the operating point by using DC voltage telemetry information of the channel amplifier which is received by a ground monitoring center.

9. A computer readable recording medium on which a program used in implementing a high power amplifier operating point determination method for use in a satellite communication system employing a processor is recorded, comprising:

first program instruction means for, to detect an operating point of a high power amplifier and a transmit power level of each channel for a down link signal transmitted from a satellite to an earth station, before satellite launching, when testing each command step of a channel amplifier, measuring a DC voltage according to an output power level of the channel amplifier in a fixed gain mode and an automatic level control mode and producing a mapping table by mapping the output power value of the high power amplifier and the DC voltage value of the channel amplifier; and second program instruction means for, after the satellite launching, determining the operating point and the output power level of the high power amplifier for a corresponding channel based on the mapping table by using the DC voltage level measured at a circuit for converting the output power level of the channel amplifier to a DC voltage as telemetry information.

* * * * *